United States Patent [19]
Takahashi

[11] Patent Number: 5,282,168
[45] Date of Patent: Jan. 25, 1994

[54] RANDOM ACCESS MEMORY DEVICE HAVING HIGH-SPEED SENSE AMPLIFIER CIRCUIT IMPLEMENTED BY BIPOLAR TRANSISTORS

[75] Inventor: Hiroyuki Takahashi, Tokyo, Japan
[73] Assignee: NEC Corporation, Tokyo, Japan
[21] Appl. No.: 767,721
[22] Filed: Sep. 30, 1991
[30] Foreign Application Priority Data
 Oct. 1, 1990 [JP] Japan .................. 2-264359
[51] Int. Cl.$^5$ .............................. G11C 13/00
[52] U.S. Cl. .................. 365/208; 365/207; 307/530
[58] Field of Search ......... 365/205, 207, 208; 307/530, 355, 356; 330/253

[56]          References Cited
       U.S. PATENT DOCUMENTS

4,553,053 11/1985 Ong et al. .................. 365/208
 4,607,172  8/1986 Frederiksen et al. ........ 365/207
 4,991,141  2/1991 Tran ....................... 307/530

Primary Examiner—Eugene R. LaRoche
Assistant Examiner—Vu A. Le
Attorney, Agent, or Firm—Sughrue, Mion, Zinn, Macpeak & Seas

[57] ABSTRACT

A random access memory device memorizes data bits in memory cells each implemented by field effect transistors arranged in a flip-flop configuration, and one of the data bits are read out to a pair of data signal lines in the form of a small difference in voltage level for increasing the magnitude of the small difference by means of a high-speed sense amplifier unit, wherein the small difference is stepped down through a pair of diode elements so that a pre-amplifying circuit implemented by bipolar transistors firstly increases the small difference with voltage levels at the anodes and cathodes of the diode elements, then the differential amplifying circuit implemented by bipolar transistors starts on increasing a differential voltage level at the output nodes of the pre-amplifying circuit so that the differential amplification is completed within a relatively short time period.

8 Claims, 6 Drawing Sheets

RANDOM ACCESS MEMORY DEVICE HAVING HIGH-SPEED SENSE AMPLIFIER CIRCUIT IMPLEMENTED BY BIPOLAR TRANSISTORS

FIELD OF THE INVENTION

This invention relates to a random access memory device and, more particularly, to a sense amplifier circuit implemented by bipolar transistors for increasing difference in voltage level on a digit line pair.

DESCRIPTION OF THE RELATED ART

Figure 1:
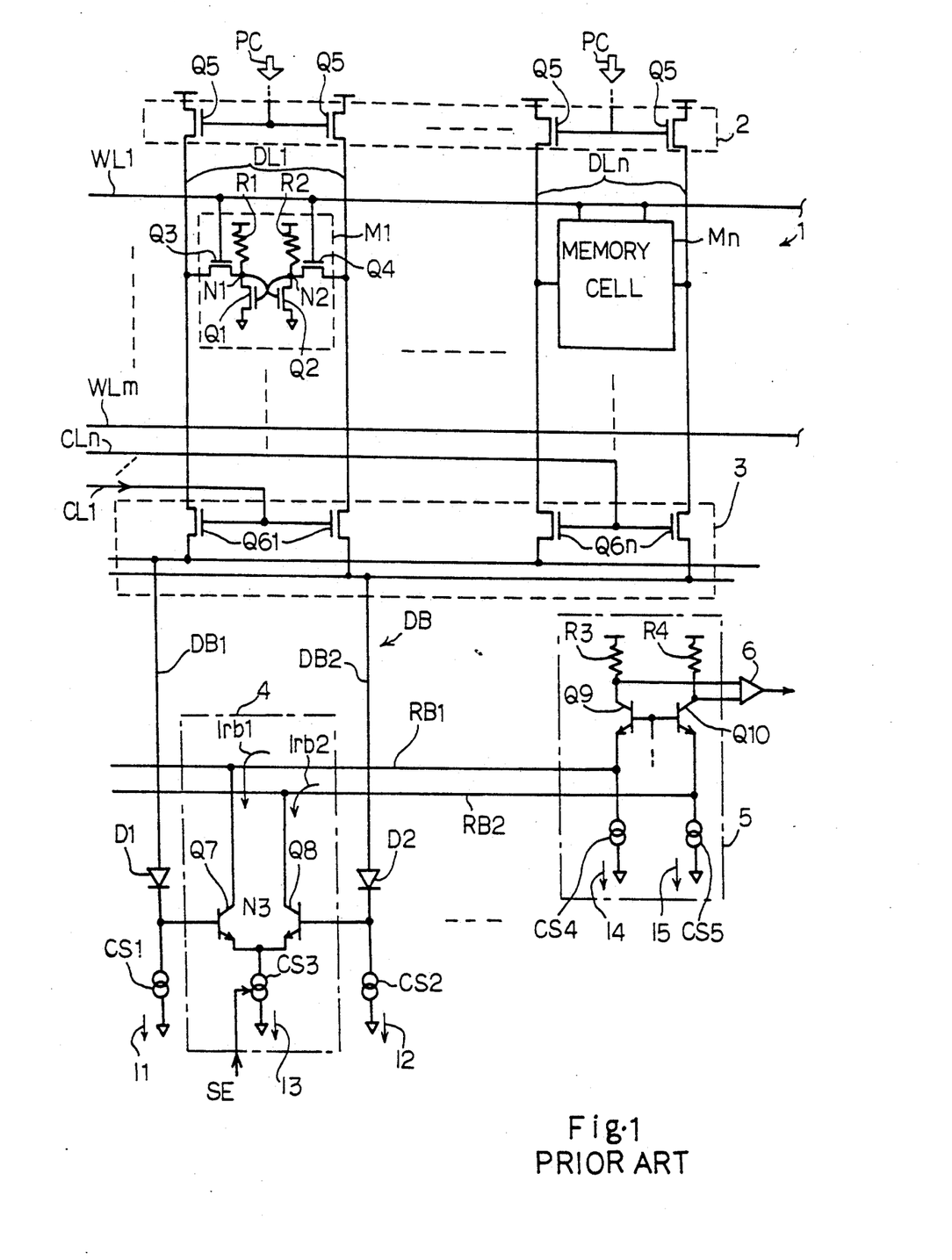
FIG. 1 is a circuit diagram showing the arrangement of the prior art random access memory device.

A typical example of the random access memory device is shown in FIG. 1 of the drawings, and comprises a memory cell array 1 implemented by a plurality of memory cells M1 to Mn coupled with a plurality of digit line pairs DL1 to DLn. The memory cells M1 to Mn are of a static type having two series combination of resistors R1 and R2 and amplifying transistors Q1 and Q2 coupled in parallel between a power voltage line and a ground voltage line and two transfer transistors Q3 and Q4 coupled between the associated digit line pair and memory nodes N1 and N2. The amplifying transistors Q1 and Q2 and the transfer transistors Q3 and Q4 are implemented by n-channel enhancement type field effect transistors. The digit line pairs DL1 to DLn are coupled through a precharging circuit 2 with the power voltage line, and the precharging circuit 2 is implemented by a plurality of p-channel enhancement type field effect transistors Q5. When a precharging signal PC goes down, the p-channel enhancement type field effect transistors Q5 concurrently turn on to precharge the associated digit line pairs DL1 to DLn. The memory cell array 1 is further associated with a plurality of word lines WL1 to WLm, and the transfer transistors Q3 and Q4 are gated by the associated word line WL1 or WLm driven by a row address decoding unit (not shown). When one of the word lines WL1 to WLm goes up, data bits are read out from the memory cells coupled with the selected word line, and small differences in voltage level take place on the associated digit line pairs DL1 to DLn, respectively.

The digit line pairs DL1 to DLn are coupled with a column selecting unit 3 which is implemented by a plurality of transfer transistors Q61 to Q6n. The transfer transistors Q61 to Q6n are of the n-channel enhancement type field effect transistor, and are gated by decoded signal lines CL1 to CLn of a column address decoding unit (not shown).

A data bus DB consists of a pair of data lines DB1 and DB2, and is shared between the digit line pairs DL1 to DLn. Namely, when one of the decoded signal lines CL1 to CLn goes up, the associated transfer transistors Q61 or Q6n turn on to couple the associated digit line pair DL1 or DLn with the data bus DL, and the small difference in voltage level is transferred from the associated digit line pair to the data bus DB. The data bus DB is coupled with a pair of diode elements D1 and D2 which in turn is coupled with a sense amplifier circuit 4 as well as current sources CS1 and CS2. The current sources CS1 and CS2 allow currents I1 and I2 to flow therethrough. The sense amplifier circuit 4 comprises a pair of n-p-n type bipolar transistors Q7 and Q8 coupled between a pair of read-out data lines RB1 and RB2 and a common emitter node N3, and a current source CS3 coupled with the common emitter node N3. The current source CS3 is activated by a selecting signal SE, and allows current I3 to pass therethrough. The small difference in voltage level on the data bus DB is shifted to a different voltage range by means of the diode elements D1 and D2, and causes different read-out current Irb1 and Irb2 to flow through the n-p-n type bipolar transistors Q7 and Q8.

The read-out data lines RB1 and RB2 are coupled with an output data unit 5 which is implemented by two series combination of resistors R3 and R4 and n-p-n type bipolar transistors Q9 and Q10 coupled in parallel between the power voltage line and current sources CS4 and CS5. Since the current sources CS4 and CS5 allows respective constant currents I4 and I5 to pass therethrough, the read-out currents Irb1 and Irb2 are causative of the difference between currents respectively passing through the n-p-n type bipolar transistors Q9 and Q10, and a large difference in voltage level takes place between the collector nodes of the n-p-n type bipolar transistors Q9 and Q10. The large difference in voltage level is supplied to an output buffer circuit 6, and the output buffer circuit 6 supplies an output data signal to the outside thereof.

However, if the small difference in voltage level on the data bus DB1 and DB2 does not sufficiently develop, the n-p-n bipolar transistors Q7 and Q8 of the sense amplifying unit 4 are hardly responsive thereto. The difference in voltage level is gradually developed by the amplifying transistors Q1 and Q2, and is propagated to the data bus DB. The larger that difference is, the longer the time period is. The prior art sense amplifying unit 4 consumes prolonged time period before reaching a certain degree of development. Thus, the prior art random access memory device encounters a problem in that a prolonged period of time occurs between the selection of the word line WL1 or WLm and the activation of the sense amplifying unit 4.

SUMMARY OF THE INVENTION

It is therefore an important object of the present invention to provide a random access memory device which is further accelerated for a data read-out operation.

To accomplish this object, the present invention proposes to provide a pre-amplifying circuit between a pair of step-down elements and a first difference amplifying circuit for driving a second difference amplifying circuit.

In accordance with one aspect of the present invention, there is provided a semiconductor memory device fabricated on a single semiconductor chip, comprising: a) a plurality of memory cells arranged in rows and columns, and respectively storing data bits at drain nodes of field effect transistors forming parts of the plurality of memory cells; b) a plurality of digit line pairs respectively associated with the columns of the plurality of memory cells, and coupled with the associated memory cells; c) a plurality of word lines respectively associated with the rows of the memory cells, and coupled with the associated memory cells for selectively allowing the memory cells to couple with the associated digit line pairs, thereby gradually developing small differences indicative of the data bits on the associated digit line pairs; d) a column selecting unit implemented by field effect transistors, and selectively coupling the plurality of digit line pairs with a pair of data signal lines for transferring one of the small differences thereto; e) a pair of step-down elements respectively coupled with the pair of data signal lines, and having respective input nodes and respective output nodes; f) a first difference amplifying circuit implemented by bipolar transistors, and coupled between a power voltage line and a first constant current source, the first difference amplifying circuit having two sets of input nodes coupled with the input nodes and the output nodes of the pair of step-down elements for increasing the aforesaid one of the small differences so as to produce an increased difference in voltage level; g) a second difference amplifying circuit implemented by bipolar transistors, and coupled between a pair of read-out data lines and a second constant current source, the second difference amplifying circuit having a pair of input nodes supplied with the increased difference in voltage level for producing a large difference in current between the pair of read-out data lines; and h) an output data buffer circuit coupled with the pair of read-out data lines, and responsive to the large difference in current for producing an output data signal.

In accordance with another aspect of the present invention, there is provided a sense amplifying circuit associated with first and second level-shifting elements each having an input node and an output node, comprising: a) a pre-amplifying stage having a first series combination of first and second bipolar transistors coupled between a first source of voltage level and a first common node, a second series combination of third and fourth bipolar transistors coupled between the first source of voltage level and the first common node, and a first current source coupled with the first common node, the base nodes of the first and third bipolar transistors being coupled with the input nodes of the first and second level-shifting elements, the base nodes of the second and fourth bipolar transistors being coupled with the output nodes of the second and first level-shifting elements; and b) a differential amplifying stage having fifth and sixth bipolar transistors coupled in parallel between a pair of output nodes and a second common node, and a second current source coupled with the second common node, the base nodes of the fifth and sixth bipolar transistors being coupled with an intermediate node between the first and second bipolar transistors and an intermediate node between the third and fourth bipolar transistors, respectively.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 2:
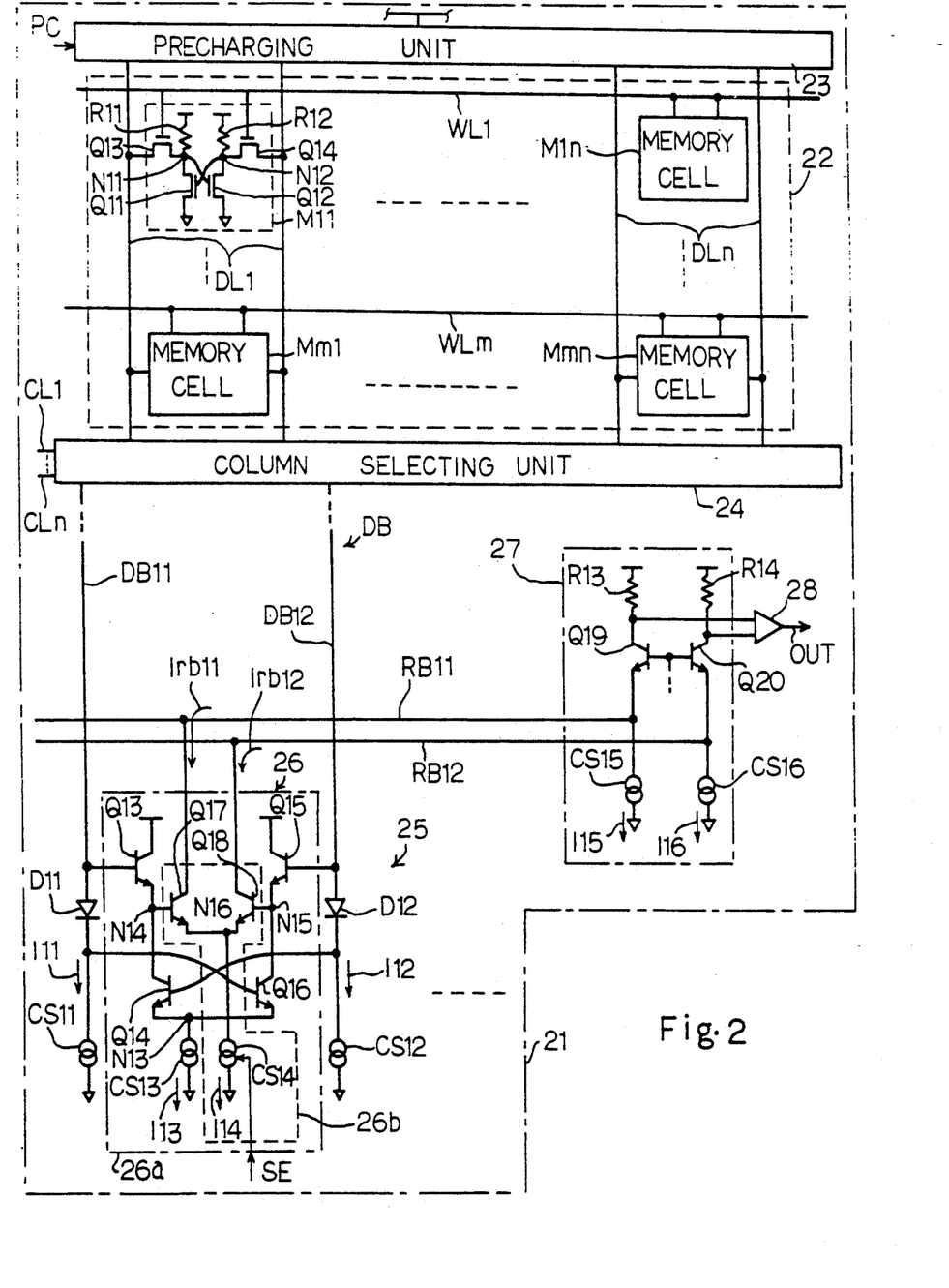
FIG. 2 is a circuit diagram showing the arrangement of a random access memory device according to the present invention.

Referring to FIG. 2 of the drawings, a static type random access memory device is fabricated on a single semiconductor chip 21, and the static type random access memory device comprises a memory cell array 22 implemented by a large number of memory cells M11, M1n, Mm1 and Mmn, and all of the memory cells M11 to Mmn are similar in arrangement. Namely, every memory cell has two series combinations of resistors R11 and R12 and amplifying transistors Q11 and Q12 coupled in parallel between a power voltage line and a ground voltage line, and transfer transistors Q13 and Q14 respectively coupled with memory nodes N11 and N12. The amplifying transistors Q11 and Q12 and the transfer transistors Q13 and Q14 are implemented by n-channel enhancement type field effect transistors, and a data bit is stored at the memory nodes N11 and N12 in the form of a difference in voltage level.

The memory cell array 22 is associated with a plurality of word lines WL11 to WL1m for the rows of the memory cells M11 to Mmn as well as with a plurality of digit line pairs DL1 to DLn for the columns of the memory cells M11 to Mmn, and the transfer transistors Q13 and Q14 are gated by the associated word lines WL1 to WLm. The transfer transistors Q13 and Q14 are further coupled with the associated digit line pair DL1 or DLn, and provide a data path between the associated digit line pair DL1 or DLn and the memory nodes N11 and N12 upon activation with the word line. Though not shown in the drawings, a row address decoding unit is coupled with the word lines WL1 to WLm and is selectively activated on the basis of row address bits.

The digit line pairs DL1 to DLn are coupled to a precharging unit 23, and the precharging unit 23 is implemented by p-channel enhancement type field effect transistors coupled between the source of power voltage level and the digit line pairs DL1 to DLn. The p-channel enhancement type field effect transistors forming the precharging unit 23 are responsive to a precharging signal PC, and precharge and equalize the associated digit line pairs DL1 to DLn. The digit line pairs DL1 to DLn are terminated at a column selecting unit 24, and the column selecting unit 24 is implemented by n-channel enhancement type field effect transistors as similar to that of the prior art random access memory device. Decoded signal lines CL1 to CLn are selectively driven by a column address decoding unit (not shown), and the column selecting unit 24 couples one of the digit line pairs DL1 to DLn with a data bus DB depending upon a selected decoded signal line.

The data bus DB consists of a pair of data signal lines DB11 and DB12, and a step-down circuit 25 is provided in association with the data bus DB. In this instance, the step-down circuit 25 is implemented by a pair of diode elements D11 and D12. A sense amplifying unit 26 has two sets of input nodes, and comprises a pre-amplifying circuit 26a associated with the sets of input nodes, and a differential amplifying circuit 26b driven by the pre-amplifying circuit 26a. A set of current sources CS11 and CS12 are further coupled with the cathodes of the diode elements D11 and D12, and currents I11 and I12 respectively flow into the current sources CS11 and CS12.

The pre-amplifying circuit 26a comprises a first series combination of first and second n-p-n type bipolar transistors Q13 and Q14 coupled between the power voltage line and a first common emitter node N13 associated with a constant current source CS13, and a second series combination of third and fourth n-p-n type bipolar transistors Q15 and Q16 coupled between the power voltage line and the common emitter node N13. The emitter nodes N14 and N15 serve as a pair of output nodes of the pre-amplifying circuit 26a, and the constant current source CS13 allows current I13 to flow thereinto. The base nodes of the first to fourth n-p-n type bipolar transistors Q13 to Q16 provide two sets of input nodes of the pre-amplifying circuit 26a, and the anodes and the cathodes are respectively coupled with the base nodes of the first and third n-p-n type bipolar transistors Q13 and Q15 and with the base nodes of the second and fourth n-p-n type bipolar transistors Q16 and Q14. The pre-amplifying circuit 26a thus arranged automatically starts increasing on a small difference in voltage level between the data signal lines D11 and D12. Namely, each of the base-emitter voltage levels Vbe of the first and third n-p-n type bipolar transistors Q13 and Q15 is dominated by the amount of collector current of the associated second or fourth n-p-n type bipolar transistor Q14 or Q16. Since the base current is ignorable with respect to the collector current, the difference in voltage level between the emitter nodes N14 and N15 dV[N14 - N15] is expressed by Equation 1 on the assumption that the base-emitter voltage levels of the first and third n-p-n type bipolar transistors Q13 and Q15 Vbe[Q13, Q15], the base-emitter voltage levels of the second and fourth n-p-n type bipolar transistors Q14 and Q16 Vbe[Q14, Q16] and the forward biasing voltage levels of the diode elements D11 and D12 Vf[D11, D12] are approximately equal to one another.

| | | |
|---|---|---|
| dV[N14 − N15] | = | V[N14] − V[N15] |
| | = | {V[DB11]− Vbe[Q13]} − {V[DB12]− Vbe[Q15]} |
| | = | {V[DB11]− Vbe[Q14]} − {V[DB12]− Vbe[Q16]} |
| | = | dV[DB11 − DB12] + dVbe[Q16 − Q14] |
| | = | dV[DB11 − DB12] + dV[DDB1 − DDB2] |
| | = | 2dV[DB11 − DB12] ... Equation 1 | where dV is a difference in voltage level, dV[DB11 - DB12] is a small difference in voltage level between the data signal lines DB11 and DB12, and dV[DDB1 - DDB2] is a difference in voltage level between the cathodes of the diode elements D11 and D12. Equation 1 teaches us that the difference in voltage level between the emitter nodes N14 and N15 is twice as large as the difference in voltage level between the data signal lines DB11 and DB12.

The difference amplifying circuit 26b comprises fifth and sixth n-p-n type bipolar transistors Q17 and Q18 coupled in parallel between a pair of read-out data lines RB11 and RB12 and a second common emitter node N16 associated with a constant current source CS14, and the constant current source CS14 is activated with an activation signal SE for allowing current I14 to flow thereinto. The base nodes of the fifth and sixth n-p-n type bipolar transistors Q17 and Q18 are coupled with the emitter nodes N14 and N15 of the first and third n-p-n type bipolar transistors Q13 and Q15, and the difference in voltage level between the emitter nodes N14 and N15 results in a large difference in current between the read-out data lines RB11 and RB12. Irb11 and Irb12 stand for the collector currents of the fifth and sixth n-p-n type bipolar transistors Q17 and Q18, respectively. In this instance, the pre-amplifying circuit 26a and the difference amplifying circuit 26b serve as first and second amplifying circuits, respectively.

Figure 3:
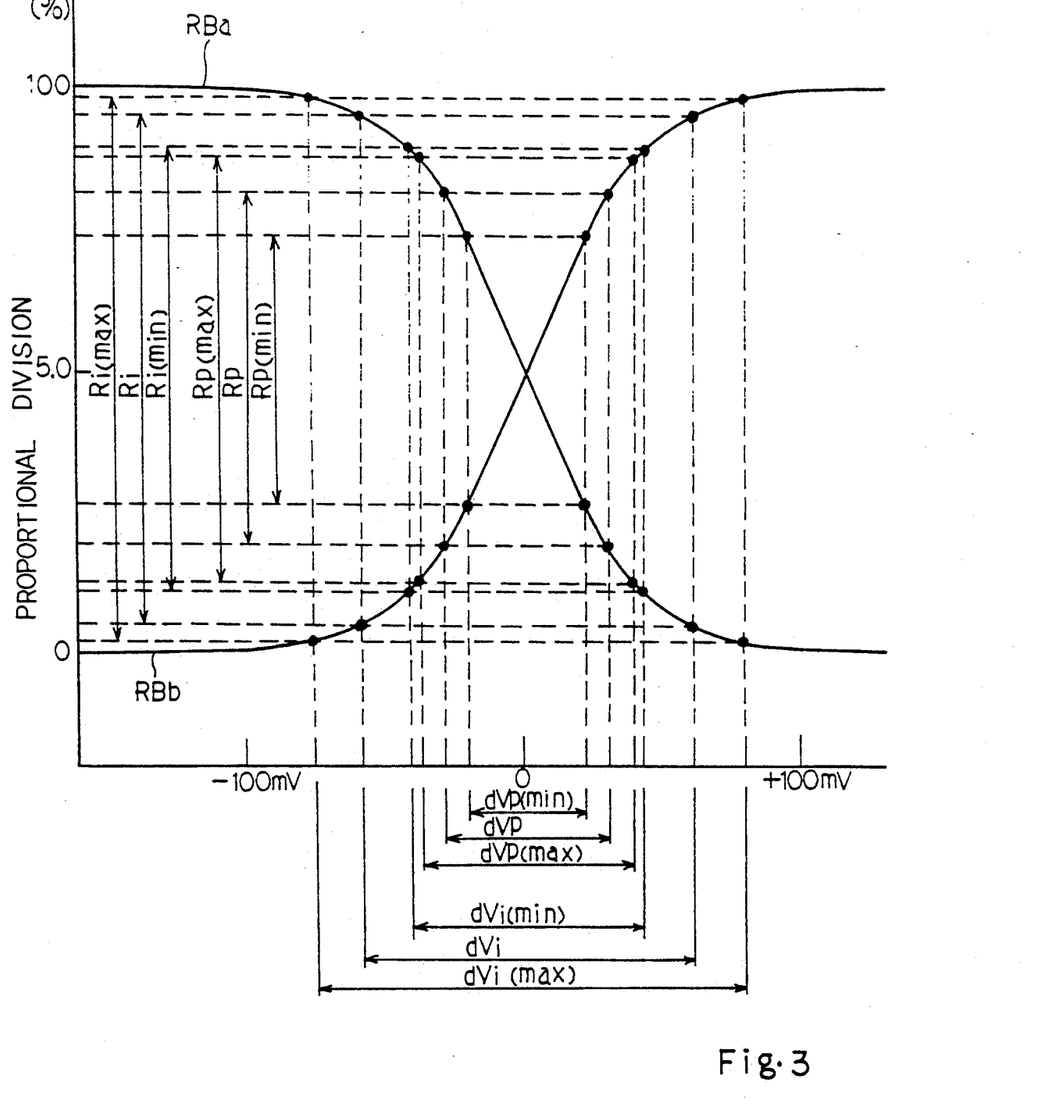
FIG. 3 is a graph showing the current distribution characteristics of a difference amplifying circuit incorporated in the random access memory device shown in FIG. 2.

The difference amplifying circuit 26b proportionally divides the current I14 between the read-out data lines RB11 and RB12 depending upon the difference in voltage level between the emitter nodes N14 and N15. FIG. 3 shows current distribution characteristics of the difference amplifying circuit 26b and the prior art sense amplifying circuit 4 shown in FIG. 1. Plot RBa is indicative of the current Irb1 and Irb11, and plot RBb stands for the current Irb2 and Irb12. The difference in voltage level between the base nodes of the n-p-n bipolar transistors Q7 and Q8 is indicated by dVp, and dVi is indicative of the difference in voltage level between the base nodes of the fifth and sixth n-p-n type bipolar transistors Q17 and Q18. The difference in voltage level dVp in the prior art sense amplifying circuit 4 is designed to be about 60 millivolt, and the current I14 is distributed between the collector currents Irb1 and Irb2. The ratio Rp between the collector currents Irb1 and Irb2 is about 62 percent. However, fluctuation of process parameters should be taken into account, and the minimum difference dVp(min) and the maximum difference dVp(max) are estimated as 42 millivolt and 79 millivolt. The minimum difference dVp(min) of 42 millivolt results in the minimum ratio Rp(min) between the collector currents Irb1 and Irb2 of about 47 percent, and the minimum ratio Rp(min) provides the limitation to the prior art sense amplifying unit 4. In other words, the prior art sense amplifying unit 4 remains inactive until the small difference on the data bus DB is increased to the 60 millivolt, because the fluctuation may decrease the small difference to 42 millivolt.

On the other hand, the pre-amplifying circuit 26a doubles the small difference between the data signal lines DB11 and DB12. This means that the difference in voltage level dVi between the base nodes of the fifth and sixth n-p-n type bipolar transistors Q17 and Q18 is also twice as large as the difference dVp. Even if the small difference between the data signal lines DB11 and DB12 is designed to be about 60 millivolt, the difference dVi is increased to about 120 millivolt, and the ratio between the collector currents Irb11 and Irb12 is about 90 percent. If the minimum difference dVi(min) is assumed to 42 millivolt as similar to the prior art random access memory device, the ratio between the collector currents Irb11 and Irb12 is about 78 percent, and a large margin is given to the sense amplifying unit 26 according to the present invention. Such a large margin allows the sense amplifying unit 26 to start before reaching 60 millivolt, and accelerates the sense amplification.

The random access memory device implementing the first embodiment further comprises an output circuit 27 coupled with the pair of read-out data lines RB11 and RB12, and the output circuit 27 is implemented by a third series combination of a resister R13 and a seventh n-p-n type bipolar transistor Q19 coupled between the power voltage line and a constant current source CS15, and a fourth series combination of a resistor R14 and an eighth n-p-n type bipolar transistor Q20 coupled between the power voltage line and a constant current source CS16. The read-out data lines RB11 and RB12 are respectively coupled with the emitter nodes of the n-p-n type bipolar transistors Q19 and Q20, and the collector nodes of the n-p-n type bipolar transistors Q19 and Q20 are coupled with two-input output buffer circuit 28. The constant current sources CS15 and CS16 allow currents I15 and I16 to flow thereinto. Since currents on the read-out data lines RB11 and RB12 flow into the associated constant current sources CS15 and CS16, currents flowing into the n-p-n type bipolar transistors Q19 and Q20 are restricted at different degree, and a difference in current is converted into a large difference in voltage level at the collector nodes of the n-p-n type bipolar transistors Q19 and Q20. The large difference in voltage level is transferred from the collector nodes to the output buffer circuit 28, and the two-input output buffer circuit 28 produces an output data signal at the output node thereof.

Figure 4:
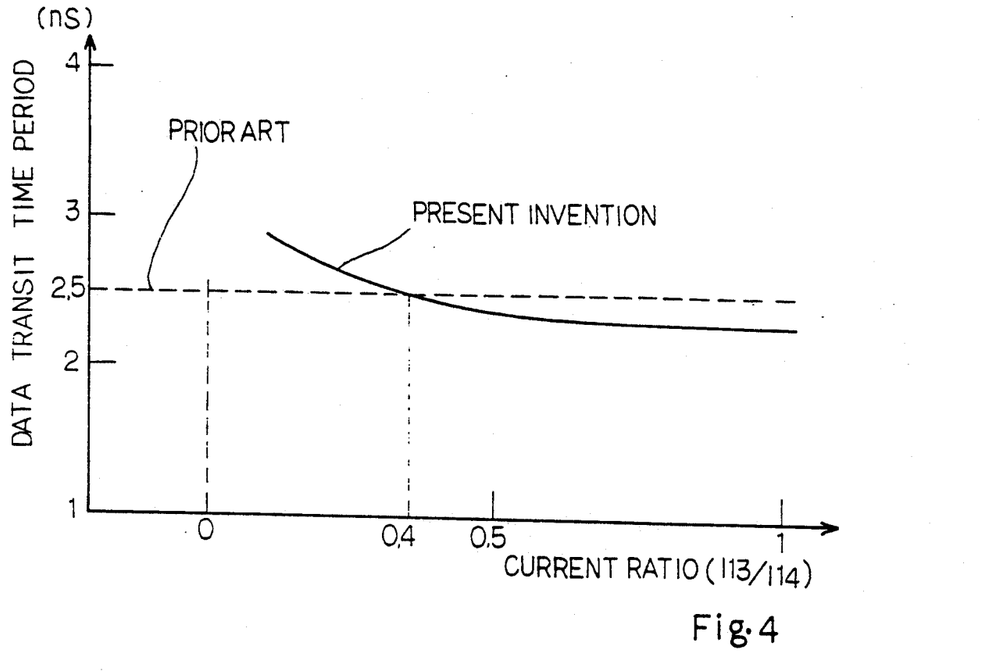
FIG. 4 is a graph showing data transit time period from the data signal lines to an data output terminal in terms of current ratio between the pre-amplifying circuit and the difference amplifying circuit.
Figure 5:
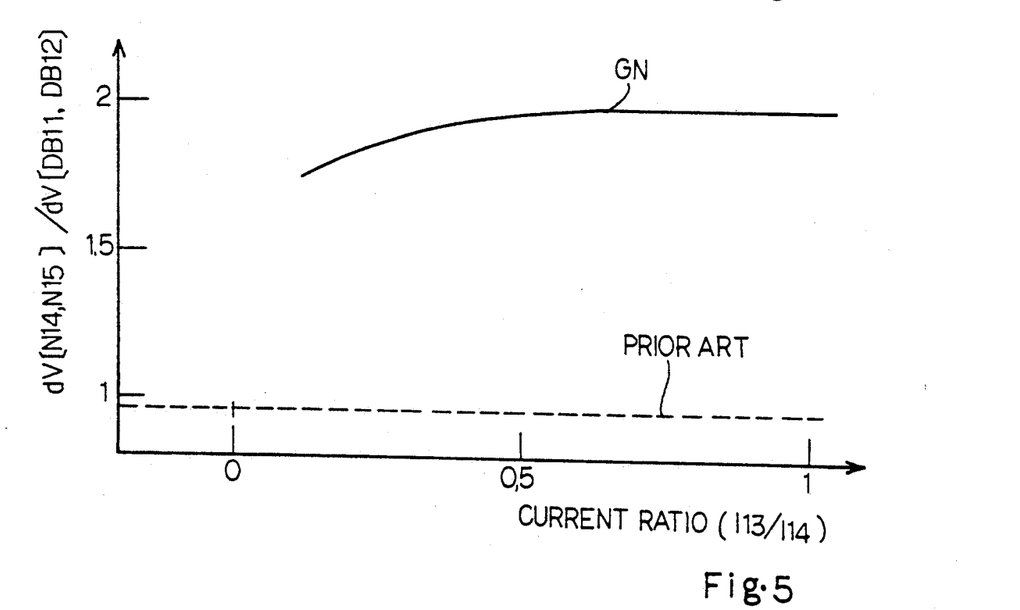
FIG. 5 is a graph showing the relation between gain of the pre-amplifying circuit and the current ratio.

FIG. 4 shows data transit time period from the data bus DB to the output node OUT in terms of current ratio between I13 and I14. Since only current I3 flows through the constant current source CS3, there is no concept of current ratio in the prior art sense amplifying unit 4, and the data transit time period is indicated by broken lines. The prior art sense amplifying unit 4 and the associated output data buffer circuit 5 need about 2.5 nanosecond so as to transfer the data bit on the data bus DB to the output node. Real line is indicative of variation of the data transit time period. While the current ratio (I13/I14) is smaller than 0.4, the data transit time period is longer than that of the prior art. The reason why the data transit time period is slow is that the switching speed of the pre-amplifying circuit 26a is decreased. The lowered switching speed of the pre-amplifying circuit 26a decreases the gain GN as shown in FIG. 4, because the base currents of the fifth and sixth n-p-n type bipolar transistors Q17 and Q18 are not ignorable. In FIG. 5, broken lines are indicative of the ratio between the data bus DB and the base nodes of the n-p-n type bipolar transistors Q7 and Q8. However, if the ratio (I13/I14) exceeds 0.4, the sense amplifying unit 26, the output circuit 27 and the data buffer circuit 28 transfer the data bit on the data bus DB faster than the prior art. When the ratio (I13/I14) reaches about 0.5, the data transit time period is faster than the prior art by about 0.2 nanoseconds. Thus, the small current ratio I13/I14 decreases the data transit time period. However, variation of the small difference on the data bus DB is slower than the response speed of the pre-amplifying circuit 26a in an actual large-scaled random access memory device, and, for this reason, the pre-amplifying circuit 26a accelerates the data transit time period without any sacrifice.

Description is hereinbelow made on circuit behaviors of the random access memory device on the assumption that a data bit stored in the memory cell M11 is accessed. First, the precharging unit 23 is responsive to the precharging signal PC, and charges and equalizes the digit line pairs DL1 to DLn. Next, the word line WL1 is lifted up, and the transfer transistors Q13 and Q14 of the memory cells M11 to M1n concurrently turn on so as to allow the data bits stored in the memory cells M11 to M1n to be read out to the associated digit line pairs DL1 to DLn. The decoded signal line CL1 causes the column selecting unit 24 to transfer the small difference from the digit line pair DB11 to the data signal lines DB11 and DB12, and the diode elements D11 and D12 shifts the voltage levels of the small difference. The small difference and the level-shifted small difference are supplied to the pre-amplifying circuit 26a, and the pre-amplifying circuit 26a supplies the difference amplifying circuit 26b a difference in voltage level twice as large as the small difference on the data bus DB. The difference amplifying circuit 26b is responsive to the difference at the base nodes thereof, and produces a difference in current between the read-out data lines RB11 and RB12. The difference in current is converted into a difference in voltage level by means of the output circuit 27, and the output buffer circuit 28 produces the output data signal indicative of the data bit read out from the memory cell M11. Since the sense amplifying unit 26 starts on increasing before reaching 60 millivolt, the data bit on the data bus DB is quickly transferred to the output data buffer circuit 28, and the access speed is surely improved.

Figure 6:
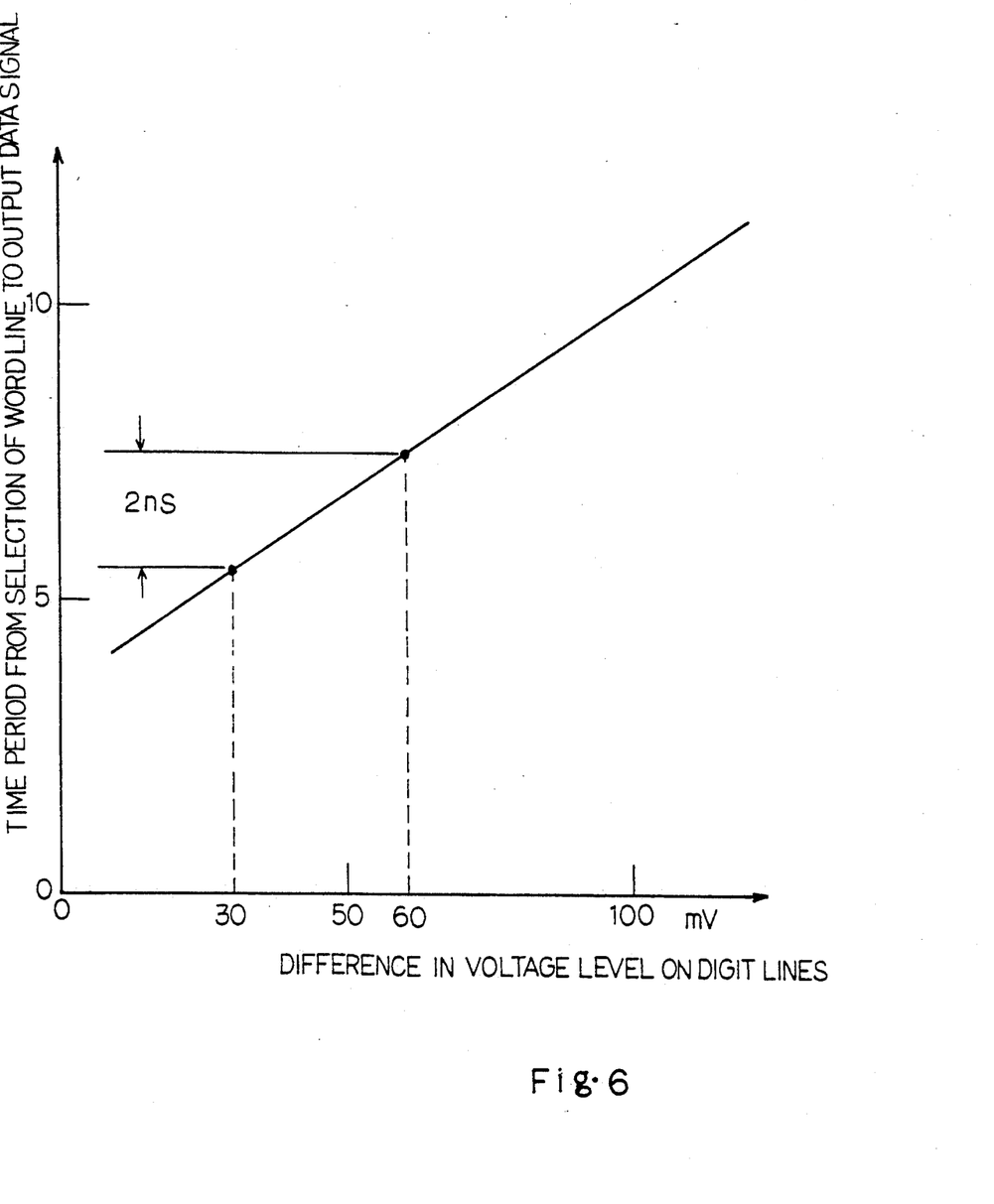
FIG. 6 is a graph showing time period consumed for data access with selection of a word line in terms of difference in voltage level on a digit line pair.

In general, a large amount of parasitic capacitance is coupled with a digit line pair and a data bus because of the length and the fan-out. In a 256K or 1M static type random access memory device, the parasitic capacitance is estimated at 2 to 5 pF. In order to achieve a high speed access, it is necessary for the sense amplifying unit 26 to start on amplification as early as possible. In other words, the access speed is related to the development of the small difference on a selected digit line pair. If the sense amplifying unit 26 is activated before the small difference is not sufficiently developed, the access speed is enhanced. FIG. 6 shows time period from selection of a word line to production of an output data signal in terms of the small difference on a selected digit line pair. As described hereinbefore, the small difference is hardly decreased below 60 millivolt in the prior art random access memory device. However, the random access memory device according to the present invention allows the sense amplifying unit 26 to start on increasing when the small difference reaches about 30 millivolts, and the time period is decreased by about 2 nanoseconds. This means that the access speed is improved by about 25 percent.

Second Embodiment

Figure 7:
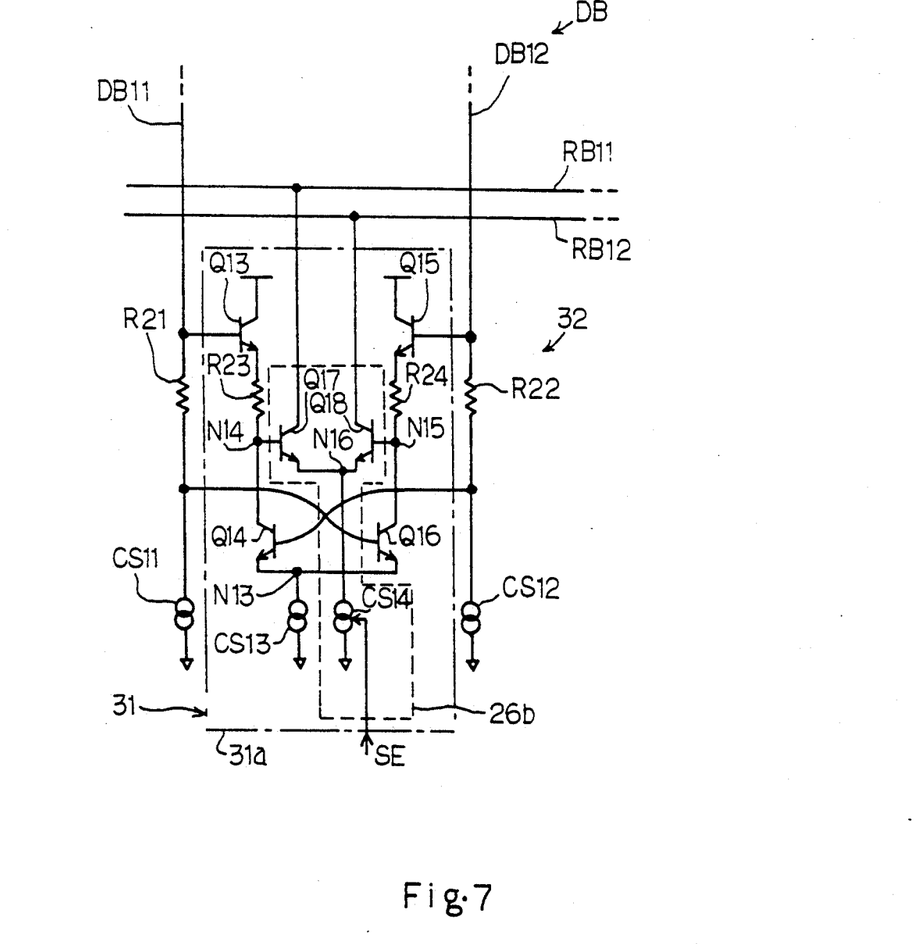
FIG. 7 is a circuit diagram showing the arrangement of another sense amplifying unit incorporated in a random access memory device according to the present invention.

Turning to FIG. 7 of the drawings, a sense amplifying unit 31 incorporated in another random access memory device is illustrated. In this instance, the step-down circuit 32 is implemented by resistors R21 and R22. The sense amplifying unit 31 is similar in arrangement to that of the first embodiment except for resistors R23 and R24, and component elements of the sense amplifying unit 31 are labeled with the same references used in FIG. 2 without any detailed description. Since the resistances of the resistors R21 and R22 are arbitrarily selected, the pre-amplifying circuit 31a can achieve a large difference more than twice as large as the small difference on the data bus DB. Appropriate resistances are provided for the resistors R23 and R24, and, accordingly, the n-p-n bipolar transistors Q14 and Q16 do not operate in a saturated state.

The pre-amplifying circuit 31a achieves a larger gain than the pre-amplifying circuit 26a, and can further improve access speed and stability.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a single semiconductor chip, comprising:
    (a) a plurality of memory cells arranged in rows and columns, and respectively storing data bits at drain nodes of field effect transistors forming parts of said plurality of memory cells;
    (b) a plurality of digit line pairs respectively associated with the columns of said plurality of memory cells, and coupled with the associated memory cells;
    (c) a plurality of word lines respectively associated with the rows of said memory cells, and coupled with the associated memory cells for selectively allowing said memory cells to couple with the associated digit line pairs, thereby gradually developing small differences indicative of said data bits on said associated digit line pairs;
    (d) a column selecting unit implemented by field effect transistors, and selectively coupling said plurality of digit line pairs with a pair of data signal lines for transferring one of said small differences thereto;
    (e) a pair of step-down elements respectively coupled with said pair of data signal lines, and having respective input nodes and respective output nodes;
    (f) a first difference amplifying circuit implemented by bipolar transistors, and coupled between a power voltage line and a first constant current source, said first difference amplifying circuit having two sets of input nodes coupled with said input nodes and said output nodes of said pair of step-down elements for increasing said one of the small differences in voltage level so as to produce an increased difference in voltage level;
    (g) a second difference amplifying circuit implemented by bipolar transistors, and coupled between a pair of read-out data lines and a second constant current source, said second difference amplifying circuit having a pair of input nodes supplied with said increased difference in voltage level for producing a large difference in current between said pair of read-out data lines; and
    (h) a third difference amplifying circuit having a pair of input nodes coupled with said pair of read-out data lines, and responsive to said large difference in current for producing an output data signal.

2. A semiconductor memory device as set forth in claim 1, in which said pair of step-down elements are diode elements.

3. A semiconductor memory device as set forth in claim 1, in which said step-down elements are implemented by first and second resistors, respectively.

4. A sense amplifying circuit associated with first and second level-shifting elements each having an input node and an output node, comprising:
    a) a pre-amplifying stage having a first series combination of first and second bipolar transistors coupled between a first source of voltage level and a first common node, a second series combination of third and fourth bipolar transistors coupled between said first source of voltage level and said first common node, and a first current source coupled with said first common node, the base nodes of said first and third bipolar transistors being coupled with the input nodes of the first and second level-shifting elements, said base nodes of said second and fourth bipolar transistors being coupled with the output nodes of said second and first level-shifting elements; and
    b) a differential amplifying stage having fifth and sixth bipolar transistors coupled in parallel between a pair of output nodes and a second common node, and a second current source coupled with said second common node, the base nodes of said fifth and sixth bipolar transistors being coupled with an intermediate node between said first and second bipolar transistors and an intermediate node between said third and fourth bipolar transistors, respectively.

5. A semiconductor memory device fabricated on a single semiconductor chip, comprising:
    (a) a plurality of memory cells arranged in rows and columns, and respectively storing data bits at drain nodes of field effect transistors forming parts of said plurality of memory cells;
    (b) a plurality of digit line pairs respectively associated with the columns of said plurality of memory cells, and coupled with the associated memory cells;
    (c) a plurality of word lines respectively associated with the rows of said memory cells, and coupled with the associated memory cells for selectively allowing said memory cells to couple with the associated digit line pairs, thereby gradually developing small differences indicative of said data bits on said associated digit line pairs;
    (d) a column selecting unit implemented by field effect transistors, and selectively coupling said plurality of digit line pairs with a pair of data signal lines for transferring one of said small differences thereto;
    (e) a pair of diode elements respectively coupled with said pair of data signal lines, and having respective input nodes and respective output nodes;
    (f) a first difference amplifying circuit implemented by bipolar transistors, and coupled between a power voltage line and a first constant current source, the first difference amplifying circuit having two sets of input nodes coupled with the input nodes and said output nodes of said pair of diode elements for increasing said one of said small differences so as to produce an increased difference in voltage level; said first difference amplifying circuit comprising a series combination of a first bipolar transistor, an output node and a second bipolar transistor coupled between said power voltage line and said first constant current source, and a series combination of a third bipolar transistor, an output node and a fourth bipolar transistor coupled between said power voltage line and said first constant current source, the input nodes of said diode elements being respectively coupled with the base nodes of said first and third bipolar transistors, the output nodes of said diode elements being respectively coupled with the base nodes of said second and fourth bipolar transistors;
    (g) a second difference amplifying circuit implemented by bipolar transistors, and coupled between a pair of read-out data lines and a second constant current source, said second difference amplifying circuit having a pair of input nodes supplied with said increased difference in voltage level for producing a large difference in current between said pair of read-out data lines; and (h) an output data buffer circuit coupled with said pair of read-out data lines, and responsive to said large difference in current for producing an output data signal.

6. A semiconductor memory device as set forth in claim 5, in which said second difference amplifying circuit comprises fifth and sixth bipolar transistors coupled in parallel between said pair of read-out data lines and said second constant current source, the base nodes of said fifth and sixth bipolar transistors being respectively coupled with said output nodes of said first difference amplifying circuit.

7. A semiconductor memory device fabricated on a single semiconductor chip, comprising:

(a) a plurality of memory cells arranged in rows and columns, and respectively storing data bits at drain nodes of field effect transistors forming parts of said plurality of memory cells;

(b) a plurality of digit line pairs respectively associated with the columns of said plurality of memory cells, and coupled with the associated memory cells;

(c) a plurality of word lines respectively associated with the rows of the memory cells, and coupled with the associated memory cells for selectively allowing said memory cells to couple with the associated digit line pairs, thereby gradually developing small differences indicative of said data bits on said associated digit line pairs;

(d) a column selecting unit implemented by field effect transistors, and selectively coupling said plurality of digit line pairs with a pair of data signal lines for transferring one of said small differences thereto;

(e) first and second resistors respectively coupled with said pair of data signal lines, and having respective current input nodes and respective current output nodes;

(f) a first difference amplifying circuit implemented by bipolar transistors, and coupled between a power voltage line and a first constant current source, said first difference amplifying circuit having two sets of input nodes coupled with said input nodes and said output nodes of said first and second resistors for increasing said one of said small differences so as to produce an increased difference in voltage level, said first difference amplifying circuit comprising a series combination of a first bipolar transistor, a third resistor, an output node and a second bipolar transistor coupled between said power voltage line and said first constant current source, and a series combination of a third bipolar transistor, a fourth resistor, an output node and a fourth bipolar transistor coupled between said power voltage line and said first constant current source, the current input nodes of said first and second resistors being respectively coupled with the base nodes of said first and third bipolar transistors, the current output nodes of said first and second resistors being respectively coupled with the base nodes of said second and fourth bipolar transistors;

(g) a second difference amplifying circuit implemented by bipolar transistors, and coupled between a pair of read-out data lines and a second constant current source, said second difference amplifying circuit having a pair of input nodes supplied with said increased difference in voltage level for producing a large difference in current between said pair of read-out data lines; and (h) an output data buffer circuit coupled with said pair of read-out data lines, and responsive to said large difference in current for producing an output data signal.

8. A semiconductor memory device as set forth in claim 7, in which said second difference amplifying circuit comprises fifth and sixth bipolar transistors coupled in parallel between said pair of read-out data lines and said second constant current source, the base nodes of said fifth and sixth bipolar transistors being respectively coupled with said output nodes of said first difference amplifying circuit.

* * * * *